(12) United States Patent
Song et al.

(10) Patent No.: US 7,687,379 B2
(45) Date of Patent: Mar. 30, 2010

(54) METHOD OF MANUFACTURING IN(AS)SB SEMICONDUCTOR ON LATTICE-MISMATCHED SUBSTRATE AND SEMICONDUCTOR DEVICE USING THE SAME

(75) Inventors: Jin-Dong Song, Seoul (KR); Ju-Young Lim, Ulsan (KR); Joonyeon Chang, Seoul (KR); Won Jun Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 69 days.

(21) Appl. No.: 11/966,580

(22) Filed: Dec. 28, 2007

(65) Prior Publication Data

US 2009/0101888 A1  Apr. 23, 2009

(30) Foreign Application Priority Data

Oct. 23, 2007  (KR) .................. 10-2007-0106577

(51) Int. Cl.
*H01L 21/20* (2006.01)
*H01L 21/36* (2006.01)
*H01L 31/00* (2006.01)
*H01L 31/20* (2006.01)

(52) U.S. Cl. .................. 438/483; 257/12; 257/14; 257/E29.071

(58) Field of Classification Search .......... 257/14, 257/E29.071, 12; 438/483
See application file for complete search history.

(56) References Cited

U.S. PATENT DOCUMENTS

| 6,177,684 | B1* | 1/2001 | Sugiyama | 257/17 |
| 2001/0023942 | A1* | 9/2001 | Kim et al. | 257/14 |
| 2006/0193088 | A1* | 8/2006 | Gurney et al. | 360/324 |
| 2007/0090337 | A1* | 4/2007 | Ueno et al. | 257/13 |
| 2007/0238281 | A1* | 10/2007 | Hudait et al. | 438/604 |
| 2007/0262292 | A1* | 11/2007 | Matsukura | 257/9 |
| 2008/0073640 | A1* | 3/2008 | Arakawa et al. | 257/14 |
| 2008/0258132 | A1* | 10/2008 | Liu et al. | 257/14 |
| 2009/0251820 | A1* | 10/2009 | Gurney et al. | 360/75 |

FOREIGN PATENT DOCUMENTS

KR  10-2001-0090165 A  10/2001

OTHER PUBLICATIONS

Söderström et al. "Molecular beam epitaxy growth and characterization of InSb layers on GaAs substrates" Semiconductor Science and Technology, vol. 7, pp. 337-343, 1992.*

(Continued)

*Primary Examiner*—Zandra Smith
*Assistant Examiner*—Jeremy J Joy
(74) *Attorney, Agent, or Firm*—Browdy and Neimark, PLLC

(57) ABSTRACT

Disclosed is a method of manufacturing a semiconductor device whereby $InAs_{(1-x)}Sb_x$ semiconductor layer is formed on an easily available and economical semiconductor substrate such as a GaAs substrate or a Si substrate. According to the method, a quantum dot layer is formed between a semiconductor substrate and a semiconductor layer to reduce defects caused by lattice mismatch between the semiconductor layer and the semiconductor layer. The method may improve the growth speed of the semiconductor layer. In addition, because the InSb layer provided by the present invention has an electron mobility greater at room temperature, it may improve the quality and productivity of the semiconductor device.

9 Claims, 9 Drawing Sheets

OTHER PUBLICATIONS

T. Zhang et al.; "High-mobility thin InSb films grown by molecular beam epitaxy" Appl. Phys. Lett. vol. 84, p. 4463, 2004.

Y.H. Kim et al.; "Effect of two-step growth on the heteroepitaxial growth of InSb thin film on Si „001 . . . substrate: A transmission electron microscopy study" Appl. Phys. Lett. vol. 89, p. 031919, 2006.

B.R. Bennett et al.' "Antimonide-based compound semiconductors for electronic devices: A review" Solid State Electronics vol. 49, p. 1875, 2005.

T. Zhang et al. "InSbepilayers on GaAs(100) for spintronic and magneto-resistive sensor applications" Physica E vol. 20, p. 216, 2004.

T. Sato et al.' "High-quality highly mismatched InSb (Ims grown on GaAs substrate via thick AlSb and $In_xAl_{1-x}Sb$ step-graded buffers" Physica E vol. 21, p. 615, 2004.

R. M. Biefeld et al., "The Metalorganic Chemical Vapor Deposition Growth of AIAsSb and InAsSb/InAs Using Novel Source Materials for Infrared Emitters", Journal of Electronic Material, vol. 26, No. 8, Mar. 1997, pp. 903-909.

* cited by examiner

METHOD OF MANUFACTURING IN(AS)SB SEMICONDUCTOR ON LATTICE-MISMATCHED SUBSTRATE AND SEMICONDUCTOR DEVICE USING THE SAME

CROSS-REFERENCE TO RELATED APPLICATIONS

This application claims all benefits of Korean Patent Application No. 10-2007-0106577 filed on Oct. 23, 2007 in the Korean Intellectual Property Office, the disclosures of which are incorporated herein by reference.

BACKGROUND OF THE INVENTION

1. Field of the Invention

The present invention relates generally to a method of manufacturing a semiconductor device and a semiconductor device using the same and, more particularly, to a method of manufacturing a semiconductor device and a semiconductor device using the same, which may improve productivity.

2. Description of the Related Art

Since In(As)Sb materials have high electron mobility and narrow band gap (approximately 78,000 cm2/Vs and 0.17 eV at room temperature) characteristics and are widely applied to a high speed Hall sensor and a long wavelength measuring device, they are attracting attention in various industrial fields. The importance, prior researches, and applications of an Sb based semiconductor are described in paper of B. R. Bennett [B. R. Bennett et al., Solid State Electronics vol. 49, pp. 1875, 2005].

An In(As)Sb layer can be manufactured by a liquid phase epitaxy (referred to as "LPE" hereinafter) method. However, the LPE method is an equilibrium growth method, which allows non-uniform mixing of materials. Thus, the LPE method is disadvantageous in that it requires high precision and depends on experiences of operators and performance of growth devices. Furthermore, since it is essentially difficult to control impurities and boundaries, only a few enterprises and research institutes are able to control the In(As)Sb layer based on unique experiences. Low quality In(As)Sb layer having a relatively low electron mobility (less than 20,000 cm$^2$/Vs) is industrially produced by a sputtering method.

Meanwhile, because a molecular beam epitaxy (referred to as "MBE" hereinafter) method or a metal organic chemical vapor deposition (referred to as "MOCVD" hereinafter) method is a non-equilibrium growth method, which can overcome the non-uniform mixing phenomenon, they are gaining focus as substitute of the LPE method. However, so as to embody the MBE method and the MOCVD method, a high quality substrate is required. As shown in FIG. 1, which is a graph showing lattice constants and band gaps of group III-V compound semiconductors [B. R. Bennett et al., Solid State Electronics vol. 49, pp. 1875, 2005], a high quality substrate suitable for an In(As)Sb having a maximum lattice constant of 0.65 nm is commercially implausible. Thus, research on a method of growing In(As)Sb using GaAs (having a lattice constant of 0.565 nm) or Si (having a lattice constant of 0.543 nm), which are industrially easy to obtain and inexpensive, has been performed actively.

For example, a high quality InSb layer is prepared on a GaAs substrate by using a low temperature-high temperature processing method (LT-HT method) [*Appl. Phys. Lett.* vol. 84, pp. 4463, 2004 by T. Zhang et al.]. An InSb layer is grown on a GaAs substrate to have an intermediate layer of AlSb [*Physica E* vol. 21, pp. 615, 2004 by T. Sato, M. Akabori, S. Yamada]. Further, an InSb layer is successively grown on an Si, GaSb, or AlSb substrate [*Appl. Phys. Lett.* vol. 89, pp. 031919, 2006. by Y. H. Kim et al.].

According to the LT-HT method, a low quality InSb layer is grown at a temperature lower than an optimum growth temperature of an InSb layer in order to form the InSb layer on a GaAs substrate, and then the growth temperature of the InSb layer is increased to the optimum growth temperature, which leads to a formation of a high quality InSb layer.

FIG. 2 is a graph showing the thickness and the electron mobility of an InSb layer grown on a GaAs substrate by the LT-HT method, which is described in *Physics E* vol. 20, pp. 216, 2004 by T. Zhang et al. As shown in FIG. 2, in order to prepare an InSb layer having high electron mobility of 50,000 cm$^2$/Vs by the LT-HT method, an InSb layer thicker than 3 um should be grown. Defects occur mainly at a lower portion of the InSb layer in the vicinity of the GaAs substrate due to the lattice constant difference (15%) between the GaAs substrate and the InSb layer. Accordingly, the thick InSb layer is formed to prevent the aforementioned defects. Consequently, the InSb layer is formed thickly to enhance the quality of an upper portion of the InSb layer. However, the thicker the InSb layer is formed, the longer manufacturing time is, thereby deteriorating the productivity.

And, in the process of forming the InSb layer, upon forming a lower layer of the InSb layer, the GaAs substrate has to be maintained at low temperature. Then, when forming an upper layer of the InSb layer, the GaAs substrate should be maintained at high temperature. This requires longer manufacturing time, which also leads to a reduction of the productivity.

SUMMARY OF THE INVENTION

Accordingly, the present invention has been made keeping in mind the above problems occurring in the prior art, and an object of the present invention is to provide a method of manufacturing an In(As)Sb semiconductor on a lattice-mismatched substrate, which is capable of offering high electron mobility and improving the productivity, and a semiconductor device using the same.

In order to accomplish the above object, the present invention provides a method of manufacturing a semiconductor device, comprising the steps of: (i) providing a semiconductor substrate; (ii) providing a quantum dot layer on the semiconductor substrate; and (iii) providing a semiconductor layer formed of InAs$_{(1-x)}$Sb$_x$, where 0<x≦1, on the quantum dot layer, wherein the quantum dot layer being formed of a compound semiconductor having a lattice constant less than that of the semiconductor layer and greater than that of the semiconductor substrate.

The semiconductor substrate can be formed of one of GaAs, InP, Si, Ge, and GaSb. The method further comprises forming a buffer layer on the semiconductor substrate, the buffer layer being formed of the same material as that of the semiconductor substrate, prior to step (ii). In one embodiment, the semiconductor substrate is formed of GaAs, the quantum dot layer is formed of InAs, and the semiconductor layer is formed of InSb.

And, in step (iii), a growth temperature of the semiconductor layer ranges from 390 to 410° C. Further, in step (iii), a flux of antimony provided on the semiconductor substrate ranges from 1.2 to 1.5e$^{-6}$ torr.

In another aspect of the present invention, there is provided a semiconductor device comprising: a semiconductor substrate; a semiconductor layer provided on the semiconductor substrate, the semiconductor layer being formed of InAs$_{(1-x)}$ $Sb_x$, where $0<x\leq1$; and a quantum dot layer provided between the semiconductor substrate and the semiconductor layer, the quantum dot layer being formed of a compound semiconductor having a lattice constant less than that of the semiconductor layer and greater than that of the semiconductor substrate.

The semiconductor substrate can be formed of one of GaAs, InP, Si, Ge, and GaSb. The semiconductor device further comprises a buffer layer provided between the semiconductor substrate and the quantum dot layer, the buffer layer being formed of the same material as that of the semiconductor substrate.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
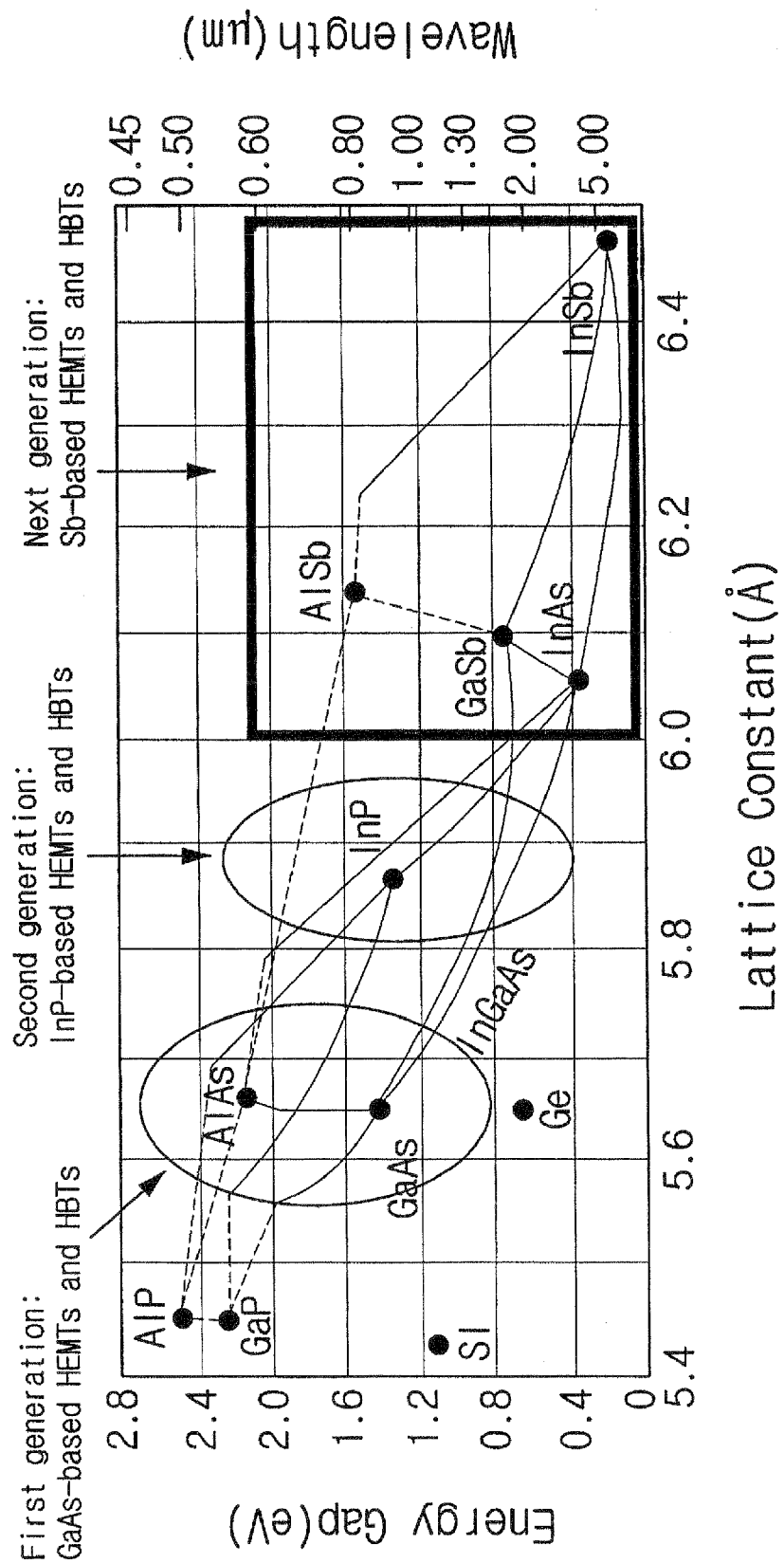
FIG. 1 is a graph showing lattice constants and band gaps of group III-V compound semiconductors (B. R. Bennet et al. Solid State Electronics vol. 49, pp. 1875, 2005)

Reference now will be made to the drawings, in which the same reference numerals are used throughout the different drawings to designate the same or similar components.

Figure 2:
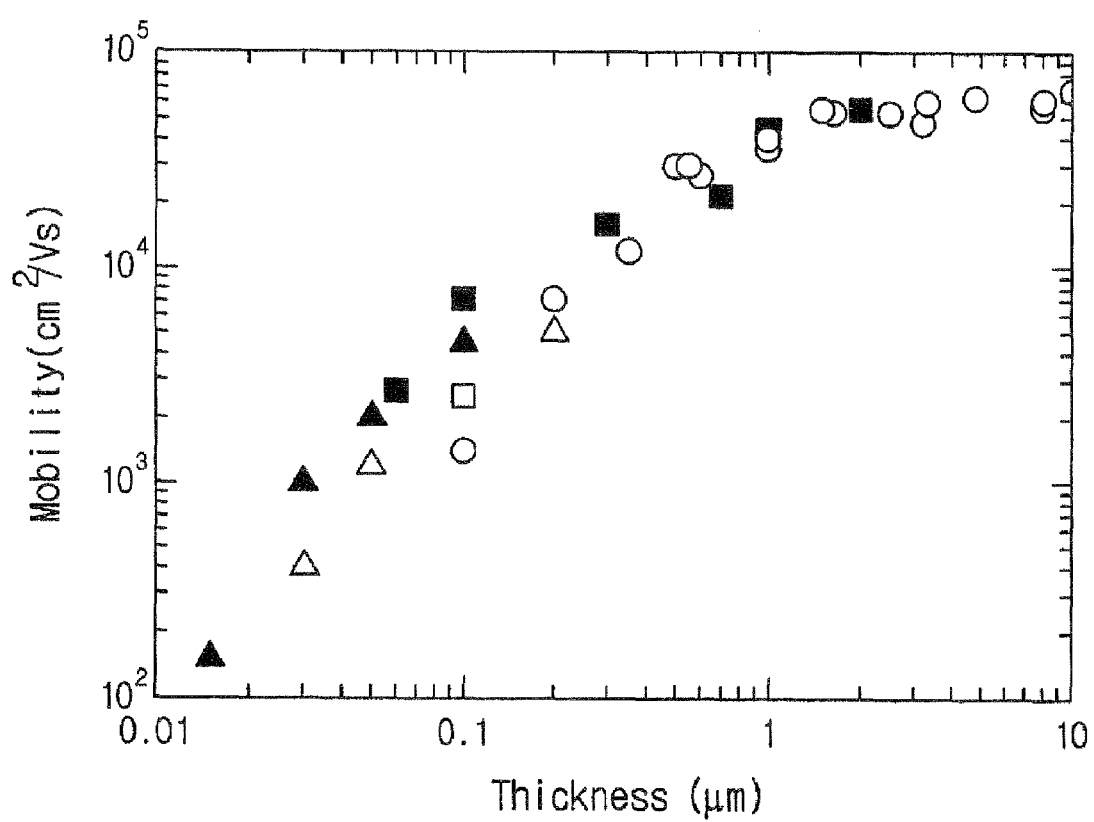
FIG. 2 is a graph showing the thickness and the electron mobility of an InSb layer grown on a GaAs substrate by the LT-HT method (T. Zhang et al. Physica E vol. 20, pp. 216, 2004)
Figure 3:
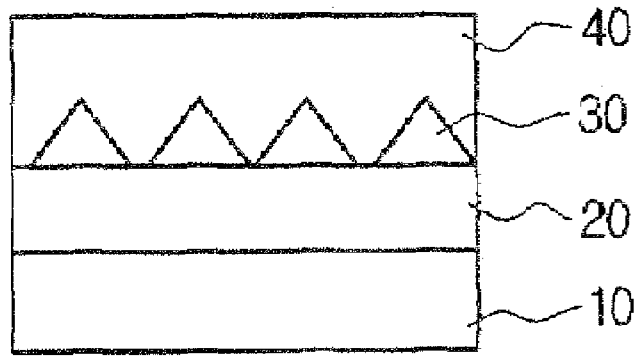
FIG. 3 is a cross-sectional view showing a method of manufacturing a semiconductor device according to the present invention.

FIG. 1 is a graph showing lattice constants and band gaps of group III-V compound semiconductors, described in B. R. Bennet et al. Solid State Electronics vol. 49, pp. 1875, 2005. FIG. 2 is a graph showing the thickness and the electron mobility of an InSb layer grown on a GaAs substrate by the LT-HT method. described in T. Zhang et al. Physica E vol. 20, pp. 216, 2004; FIG. 3 is a cross-sectional view showing a method of manufacturing a semiconductor device according to the present invention.

With reference to FIG. 3, the method of manufacturing a semiconductor device according to the present invention is as follows. First, a semiconductor substrate 10 is provided. Specifically, an oxide film formed on a surface of the semiconductor substrate 10 for prevention of oxidation is removed. The process of manufacturing a semiconductor device can be carried out in a vacuum chamber. The semiconductor substrate 10 from which the oxide film has been removed, is provided in the vacuum chamber. The semiconductor substrate 10 is fixed by a holder in the vacuum chamber. The semiconductor substrate 10 can be formed of one of GaAs, InP, Si, Ge, and GaSb. A GaAs substrate, an InP substrate, an Si substrate, or a Ge substrate is more available and economical in comparison with a GaSb substrate.

In the method of manufacturing the semiconductor device, prior to the step of forming a quantum dot layer 30 on the semiconductor substrate 10, a buffer layer 20 may be provided on the semiconductor substrate 10, which is formed of the same material as that of the semiconductor substrate 10. That is, when the semiconductor substrate 10 is formed of GaAs, the buffer layer 20 is achieved by GaAs, which is the same material as that of the semiconductor substrate 10. Further, during the formation of the buffer layer 20, the semiconductor substrate 10 is maintained at an optimal growth temperature of a material of each semiconductor substrate (in case of GaAs substrate, which ranges from 560 to 620° C.). The buffer layer functions to planarize a surface of the semiconductor substrate 10 which is roughened during the formation of the oxide film.

Next, a quantum dot layer 30 is formed on the semiconductor substrate 10. The quantum dot layer 30 is achieved by a compound semiconductor, which has a lattice constant less than that of the semiconductor layer 40 provided on the quantum dot layer 30 and greater than that of the semiconductor substrate 10. The semiconductor layer 40 is formed of $InAs_{(1-x)}Sb_x$, where $0<x\leq1$.

Referring to FIG. 1, in an embodiment of the present invention, when the semiconductor substrate 10 is formed of GaAs, the quantum dot layer 30 may be formed of InAs. InAs has a lattice constant which is less than that of $InAs_{(1-x)}Sb_x$ and greater than that of GaAs.

The quantum dot layer 30 is formed between the semiconductor substrate 10 and the semiconductor layer 40, such that defects due to a lattice mismatch between the semiconductor substrate 10 and the semiconductor layer 40 can be reduced. Accordingly, the semiconductor layer 40 formed of $InAs_{(1-x)}Sb_x$ with less defects can be provided on the semiconductor substrate 10, which is formed of any one of GaAs, InP, Si, Ge, and GaSb, which are easily available and economical.

The quantum dot layer 30 comprises quantum dots having a three-dimensional island structure. The quantum dot layer 30 has a lattice constant greater than that of the semiconductor substrate 10. It is because a lattice constant of a compound semiconductor itself, which forms the quantum dot layer 30, is greater than that of the semiconductor substrate 10 and a lattice constant of a sloped surface of a three-dimensionally grown quantum dot layer is greater than that of the compound semiconductor, which forms the quantum dot layer 30.

Moreover, since the procedure of forming the semiconductor layer 40 on the quantum dot layer 30 is similar to the three-dimensionally non-uniform mixing of the compound semiconductor forming the quantum dot layer 30 and the $InAs_{(1-x)}Sb_x$ forming the semiconductor layer 40, defects due to a lattice mismatch can be minimized. The reason is because the non-uniform mixing phenomenon is more stable than the breaking of the lattice.

Meanwhile, the temperature of the semiconductor substrate 10 in the formation step of the quantum dot layer 30 is lower than that in the formation step of the buffer layer 20, which is an optimal temperature to grow a quantum dot. For example, in case a quantum dot formed of InAs is grown, the semiconductor substrate 10 is maintained at a temperature ranging from 450 to 520° C. Further, the temperature of the semiconductor substrate 10 in the formation step of the semiconductor layer 40 is maintained lower than that in the formation step of the quantum dot layer 30, which is an optimized temperature for each composition of the In(As)Sb. For example, in case a semiconductor layer 40 formed of InSb is formed, the temperature of the semiconductor substrate 10 ranges from 390 to 410° C. Accordingly, during the formation of the semiconductor device 50, the temperature of the semiconductor substrate 10 is adjusted to be gradually reduced, and, thus, the manufacturing time of the semiconductor device 50 may be shortened.

The buffer layer 20, the quantum dot layer 30, and the semiconductor layer 40 may be formed by using various kinds of thin film formation methods. For example, there is molecular beam epitaxy (referred to as "MBE" hereinafter) or organic metal vapor phase epitaxy (MOVPE) as a preferred method to form them.

Hereinafter, a preferred embodiment of the present invention will be explained with reference to the accompanying drawings. Although the preferred embodiments of the present invention have been disclosed for illustrative purposes, those skilled in the art will appreciate that various modifications, additions and substitutions are possible.

Figure 4A:
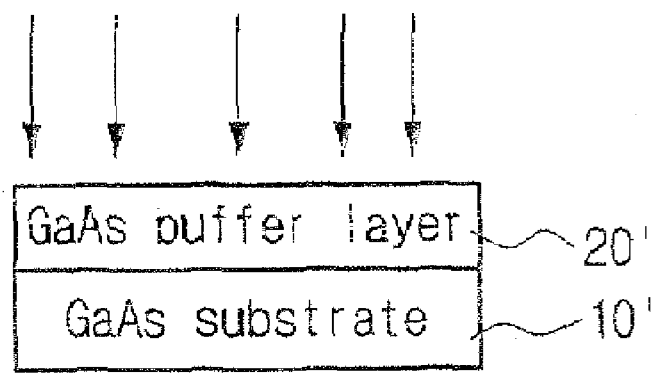
FIG. 4A is a cross-sectional view showing a procedure of forming a GaAs buffer layer on a GaAs substrate.
Figure 4B:
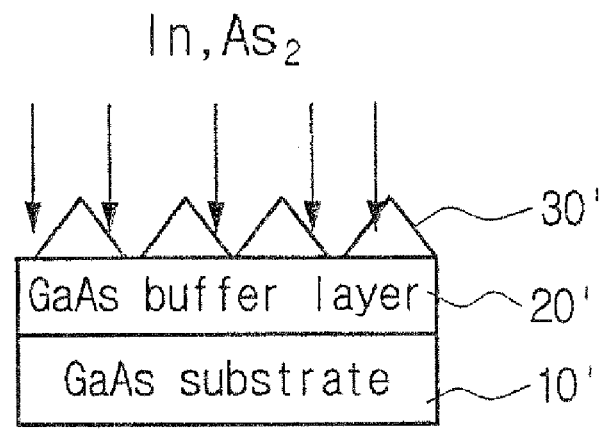
FIG. 4B is a cross-sectional view showing a procedure of forming a quantum dot layer on the GaAs substrate.
Figure 4C:
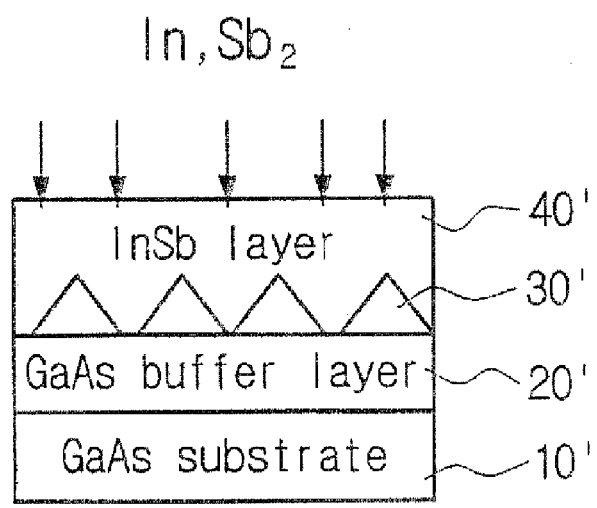
FIG. 4C is a cross-sectional view showing a procedure of forming a semiconductor layer on the GaAs substrate.
Figure 5:
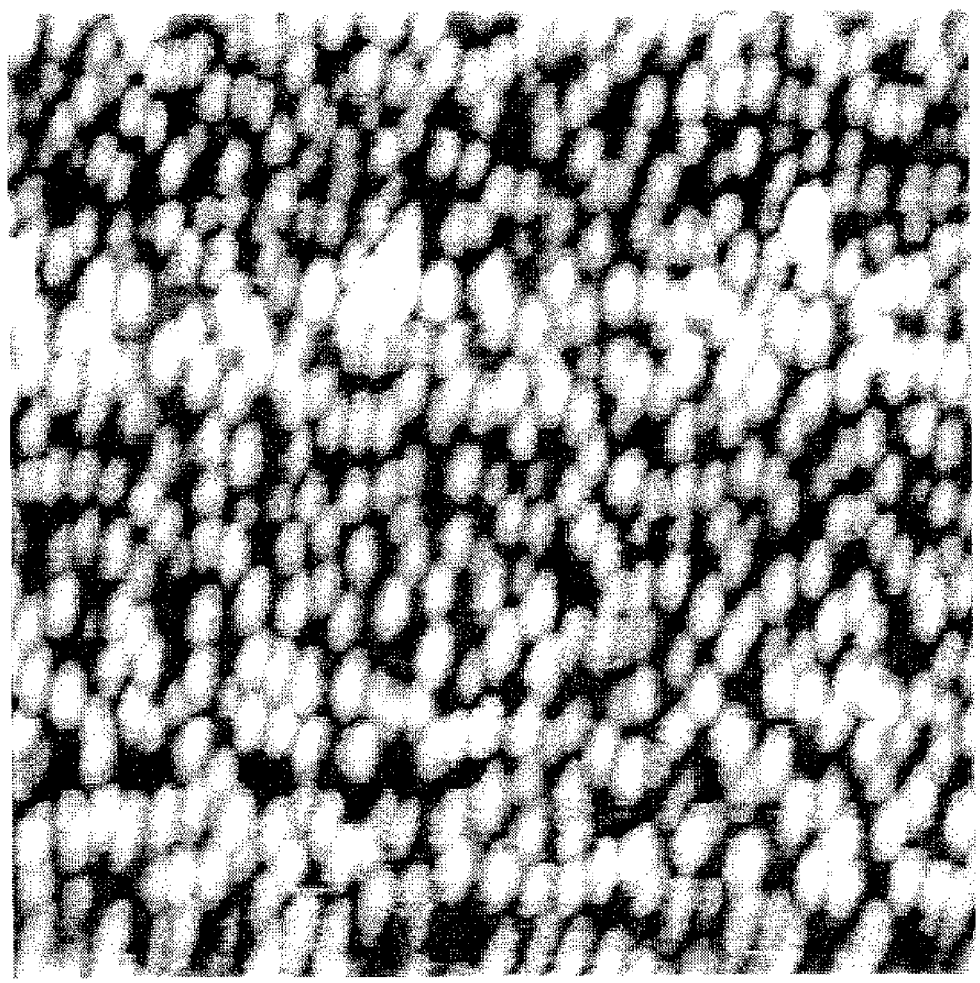
FIG. 5 is a view showing an automatic force microscope (referred to as "AFM" hereinafter) 1 um×1 um image of an InAs quantum dot layer according to the present invention.

FIG. 4A is a cross-sectional view showing a procedure of forming a GaAs buffer layer on a GaAs substrate. FIG. 4B is a cross-sectional view showing a procedure of forming a quantum dot layer on the GaAs substrate. FIG. 4C is a cross-sectional view showing a procedure of forming a semiconductor layer on the GaAs substrate. FIG. 5 is a view showing an AFM 1 um×1 um image of an InAs quantum dot layer according to the present invention.

In the embodiment of the present invention, a GaAs substrate 10' is used as a semiconductor substrate, a quantum dot layer 30' is formed of InAs, and a semiconductor layer is an InSb layer 40' formed of InSb. A GaAs buffer layer 20', the quantum dot layer 30', and the InSb layer 40' are provided in an MBE chamber by an MBE method. The MBE chamber employed in the embodiment of the present invention is a Compact 21E model by Riber Company, and uses an ion getter pump and a cryogenic pump as main pump. After filling of liquid nitrogen, the inside of the MBE chamber is maintained as vacuum under a pressure of $1 \times 10^{-10}$ torr.

A standard K-cell may be used as indium (In) source and gallium (Ga) source. A Valved Cracker may be used as arsenic (As) source and antimony (Sb) source. The arsenic (As) and the antimony (Sb) are provided in a form of $As_2$ and $Sb_2$, respectively. To do this, each Valved Cracker of $As_2$ and $Sb_2$ is heated to a temperature of 900° C.

With reference to FIG. 4A, the inside of the MBE chamber is rendered under arsenic (As) atmosphere, the GaAs substrate 10' is heated to approximately 600° C. under the arsenic (As) atmosphere, and then an oxide film at the surface thereof is removed. Next, the GaAs substrate 10' is maintained at 580° C., and gallium and arsenic are provided to form a GaAs buffer layer 20'. Here, the gallium may be provided with a flux corresponding to GaAs growth rate of 0.05 to 0.4 nm/sec, and the arsenic may be provided with a flux corresponding to a beam equivalent pressure of 0.5 to $3.0 \times 10^{-6}$ torr. In the embodiment of the present invention, the gallium is provided with a flux corresponding to GaAs growth rate of 0.14 nm/sec, and the arsenic is provided with a flux corresponding to a beam equivalent pressure of $1.2 \times 10^{-6}$ torr, thereby growing a GaAs buffer layer 20' having a thickness of approximately 100 nm.

Referring to FIG. 4B, subsequently, the temperature of the GaAs substrate 10' is lowered to 480° C. to grow a quantum dot layer 30' corresponding to a thickness of 3 mono-layers. During the formation of the quantum dot layer 30', the indium may be provided with a flux corresponding to InP growth rate of 0.05 to 0.3 nm/s. In the embodiment of the present invention, the indium is provided with a flux corresponding to InP growth rate of 0.14 nm/s. The quantum dot layer 30' is achieved by InAs quantum dot, which is naturally formed by the energy caused due to a lattice match between InAs and the GaAs substrate 10'. As shown in FIG. 5, the InAs quantum dot has an island structure, which is a three-dimensional structure.

Referring to FIG. 4C, subsequently, the temperature of the GaAs substrate 10' is lowered to a temperature suitable for the growth of InSb layer 40', and indium and antimony are provided on the GaAs substrate 10' to form an InSb layer 40'. Here, the indium may be provided with a flux corresponding to an InP growth rate of 0.1 to 0.5 nm/s. In the embodiment of the present invention, the indium is provided with a flux corresponding to an InP growth rate of 0.4 nm/s.

Meanwhile, in order to form a high quality InSb layer 40' having electron mobility of a predetermined level on the GaAs substrate 10', it is required to optimize growth variables such as the flux of the antimony and the growth temperature of the InSb layer 40'.

Figure 6A:
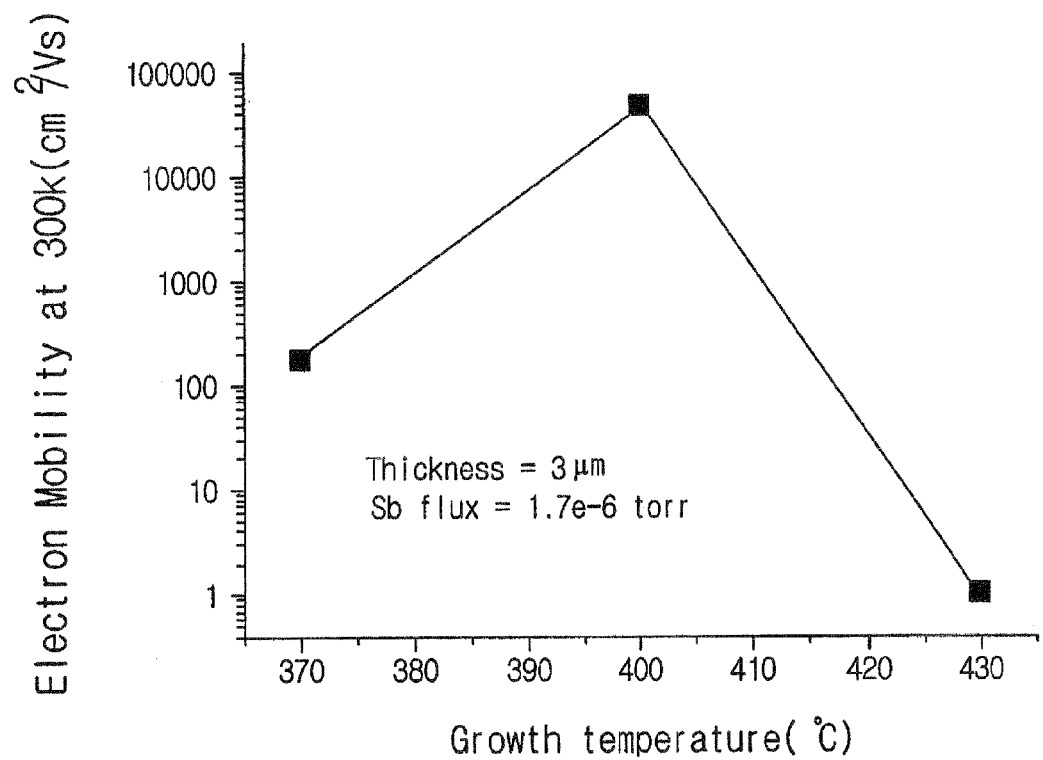
FIG. 6A is a graph showing an electron mobility of an InSb layer according to a growth temperature of the InSb.

FIG. 6A is a graph showing the electron mobility of the InSb layer according to the growth temperature of the InSb.

Referring to FIG. 4C and FIG. 6A, a flux of antimony is maintained at $1.7e^{-6}$ torr, and each InSb layer 40' is grown at each different growth temperature, so that an InSb layer 40' having a thickness of 3 um is formed. After the formation of the InSb layer 40', the electron mobility of the InSb layer 40' is measured at room temperature and the change in the electron mobility of the InSb layer 40' according to the growth temperature of the InSb layer 40' is depicted on a graph.

Meanwhile, in the embodiment of the present invention, the electron mobility of the InSb layer 40' is measured by a standard 4-points Van der Pauw method, using HMS-3000 equipment from Ecopia. The 4 contact points are formed using indium, using a 0.55 T magnet.

As shown in FIG. 6A, the electron mobility of the InSb layer 40' is sensitively influenced by the growth temperature of the InSb layer 40'. The InSb layer 40' has an electron mobility of 46,300 to 48,300 $cm^2/Vs$ in the growth temperature range from 390 to 410° C. Accordingly, a high quality InSb layer 40' can be formed at a temperature ranging from 390 to 410° C.

Figure 6B:
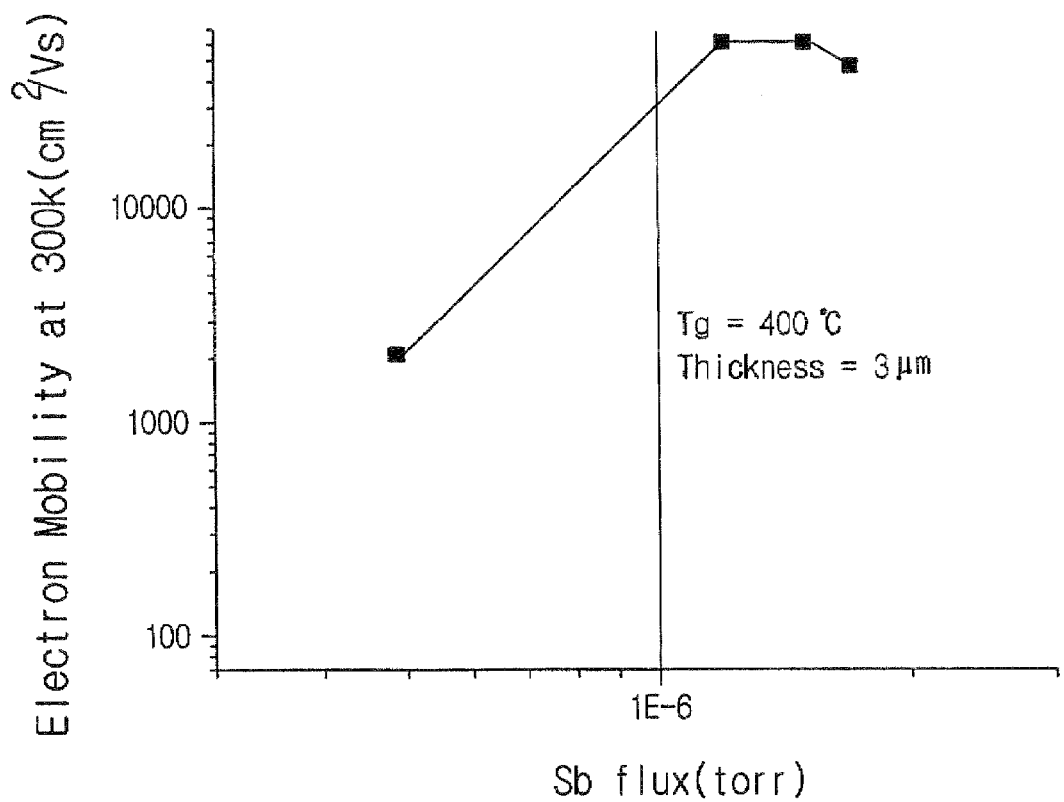
FIG. 6B is a graph showing electron mobility of an InSb layer according to a flux of antimony.

FIG. 6B is a graph showing the electron mobility of an InSb layer according to the flux of antimony.

With reference to FIG. 4C and FIG. 6B, the growth temperature of the InSb layer 40' is maintained at 400° C., and each InSb layer 40' is grown while correcting the flux of antimony to form an InSb layer 40' having a thickness of 3 um. After the formation of the flux of antimony, the electron mobility of the InSb layer 40' is measured at room temperature and the electron mobility of the InSb layer 40' according to the growth temperature of the InSb layer 40' is depicted on a graph.

As shown in FIG. 6B, the electron mobility of the InSb layer 40' is sensitively influenced by the flux of antimony. A high quality InSb layer 40' having an electron mobility of 59,000 to 61,000 $cm^2/Vs$ can be grown at an antimony flux ranging from 1.2 to $1.5e^{-6}$ torr. Accordingly, it understood that 1.2 to $1.5e^{-6}$ torr is an optimal range in the flux of antimony.

Figure 7:
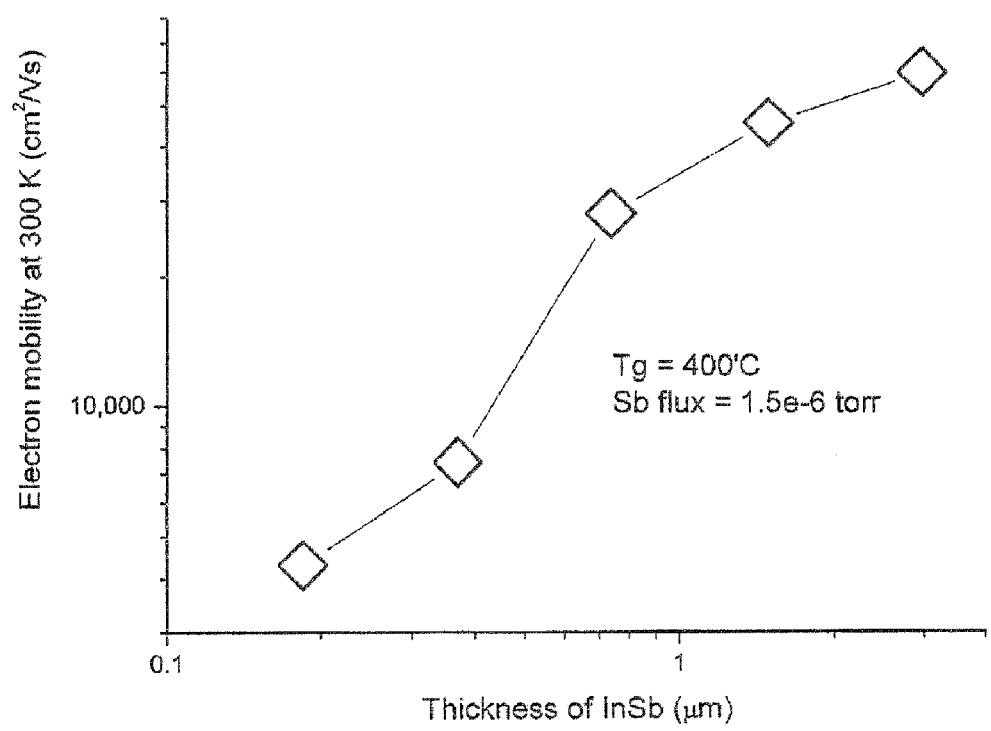
FIG. 7 is a graph showing an electron mobility according to a thickness of an InSb layer formed on the GaAs substrate according to an embodiment of the present invention.
Figure 8:
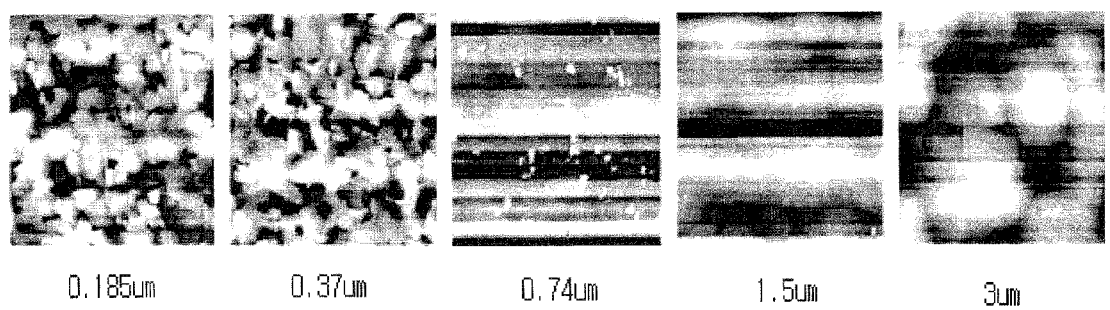
FIG. 8 is a view showing an AFM image of an InSb layer according to a thickness of an InSb layer formed on the GaAs substrate according to an embodiment of the present invention.

FIG. 7 is a graph showing the electron mobility according to the thickness of the InSb layer formed on the GaAs substrate according to an embodiment of the present invention. FIG. 8 is a view showing an AFM image of the InSb layer formed on the GaAs substrate according to an embodiment of the present invention.

For example, under the above-described optimal condition, that is, under an optimum condition where the flux of the antimony is $1.5e^{-6}$ torr and the growth temperature of the InSb layer 40' is 400° C., after the InSb layer 40' is formed, the electron mobility according to the thickness of the InSb layer 40' is measured at room temperature.

As shown in FIG. 7, as the thickness of the InSb layer 40' increases, the electron mobility of the InSb layer 40' also increases. As shown in FIG. 8, the reason is because the defects of the InSb layer 40' caused by a lattice mismatch decrease as the thickness of the InSb layer 40' increases.

In particular, the InSb layer 40' having a thickness of 3 um has an electron mobility of 60,400 $cm^2/Vs$ at room temperature. This electron mobility exceeds the maximum value of electron mobility of the InSb layer manufactured by the conventional LT-HT method, and hence the InSb layer 40' formed on the GaAs substrate 10' according to the present invention has the highest quality. Accordingly, the semiconductor device according to the present invention can be used for a high speed magnetic sensor and an infrared ray sensor of 2 to 5 um band.

Moreover, since defects caused by a lattice mismatch between the GaAs substrate 10' and the InSb layer 40' are reduced by the quantum dot layer 30', an InSb layer 40' having a thickness smaller than that of the InSb layer manufactured by a conventional LT-HT method can be manufactured according to the present invention. The reason is because the lattice constant of InAs forming the quantum dot layer 30' is greater than that of the GaAs, and the lattice constant of the sloped surface of three-dimensionally grown InAs is greater than that of InAs itself. Thus, InAs having a lattice constant of 0.6 nm may be grown into an InAs quantum dot having a maximum lattice constant of 0.8 nm (0.6 nm×√2) Furthermore, since the procedure of forming the semiconductor layer 40 on the quantum dot layer 30 corresponds to a procedure where InAs and InSb are non-uniformly mixed, it can minimize defects due to the lattice mismatch.

Meanwhile, during the formation of the semiconductor device according to the embodiment of the present invention, because the temperature of the GaAs substrate 10' is adjusted to be gradually reduced, the manufacturing time of the semiconductor device can be shortened. In addition, the growth speed of the InSb layer 40', which is ~3 um/hr, is greater than that in the conventional LT-HT method.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As is seen from the forgoing description, according to the method of manufacturing the semiconductor device, defects caused by lattice mismatch between a semiconductor layer formed of $InAs_{(1-x)}Sb_x$ and a semiconductor substrate may be reduced by a quantum dot layer. Accordingly, a high quality semiconductor layer can be grown on an easily available and economical semiconductor substrate, such as an Si substrate, a Ge substrate, a GaAs substrate or an InP substrate.

Moreover, during the formation of the semiconductor device, since the temperature of the semiconductor substrate is adjusted to be gradually reduced, the present invention can shorten the manufacturing time of the semiconductor device in comparison with the conventional method.

In addition, because the InSb layer provided by the present invention has an electron mobility greater than that provide by the conventional method, it may improve the quality of the semiconductor device.

What is claimed is:

1. A method of manufacturing a semiconductor device comprising:
   (i) providing a GaAs substrate;
   (ii) forming an InAs quantum dot layer on the GaAs substrate; and
   (iii) forming an InSb semiconductor layer on the InAs quantum dot layer,
   wherein, during said step of forming the InSb semiconductor layer, the flux of antimony provided on the GaAs substrate ranges from $1.2e^{-6}$ to $1.5e^{-6}$ torr.

2. The method of claim 1, wherein, during said step of forming the InSb semiconductor layer, the temperature of the GaAs substrate ranges from 390 to 410° C.

3. The method of claim 2, further comprising forming a GaAs buffer layer on the GaAs substrate prior to the step of forming the InAs quantum dot layer.

4. The method of claim 3, wherein, during said steps of forming the GaAs buffer layer, the InAs quantum dot layer and InSb semiconductor layer, respectively, the temperature of the GaAs substrate of each step is controlled to be lower than that of the prior step.

5. The method of claim 4, wherein:
   during the step of forming the GaAs buffer layer, the temperature of the GaAs substrate ranges from 560 to 620° C.;
   during the step of forming the InAs quantum dot layer, the temperature of the GaAs substrate ranges from 450 to 520° C.; and
   during the step of forming the InSb semiconductor layer, the temperature of the GaAs substrate ranges from 390 to 410° C.

6. A semiconductor device manufactured by the method of claim 1.

7. A semiconductor device manufactured by the method of claim 5.

8. The semiconductor device of claim 6, wherein:
   the InAs quantum dot layer is arranged between the GaAs substrate and the InSb semiconductor layer, and
   the InSb semiconductor layer has an electron mobility of 59,000 to 61,000 $cm^2/Vs$.

9. The semiconductor device of claim 7, wherein:
   the InAs quantum dot layer is arranged between the GaAs substrate and the InSb semiconductor layer, and
   the InSb semiconductor layer has an electron mobility of 59,000 to 61,000 $cm^2/Vs$.

* * * * *